(12) United States Patent
Lie et al.

(10) Patent No.: US 10,734,523 B2
(45) Date of Patent: Aug. 4, 2020

(54) NANOSHEET SUBSTRATE TO SOURCE/DRAIN ISOLATION

(71) Applicant: INTERNATIONAL BUSINESS MACHINES CORPORATION, Armonk, NY (US)

(72) Inventors: Fee Li Lie, Albany, NY (US); Mona Ebrish, Albany, NY (US); Ekmini A. De Silva, Slingerlands, NY (US); Indira Seshadri, Niskayuna, NY (US); Gauri Karve, Cohoes, NY (US); Lawrence A. Clevenger, Saratoga Springs, NY (US); Leigh Anne H. Clevenger, Rhinebeck, NY (US); Nicolas Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 57 days.

(21) Appl. No.: 16/102,198

(22) Filed: Aug. 13, 2018

(65) Prior Publication Data

US 2020/0052107 A1  Feb. 13, 2020

(51) Int. Cl.
*H01L 29/78* (2006.01)
*H01L 29/66* (2006.01)
(Continued)

(52) U.S. Cl.
CPC .......... *H01L 29/785* (2013.01); *H01L 21/762* (2013.01); *H01L 21/823481* (2013.01);
(Continued)

(58) Field of Classification Search
CPC ............... H01L 29/785; H01L 29/6681; H01L 29/0847; H01L 29/0649; H01L 29/66545;
(Continued)

(56) References Cited

U.S. PATENT DOCUMENTS 6,190,979 B1   2/2001  Radens et al.
8,859,389 B2  10/2014  Kawasaki et al.
(Continued)

OTHER PUBLICATIONS

Loubet et al., "Stacked Nanosheet Gate-All-Around Transistor to Enable Scaling Beyond FinFET", 2017 Symposium on VLSI Technology. Digest of Technical Papers. Jun. 5-8, 2017. pp. 1-2.
(Continued)

*Primary Examiner* — Fernando L Toledo
*Assistant Examiner* — Adam S Bowen
(74) *Attorney, Agent, or Firm* — Tutunjian & Bitetto, P.C.; L. Jeffrey Kelly (57) ABSTRACT

A method of forming a nanosheet device is provided. The method includes forming a nanosheet channel layer stack and dummy gate structure on a substrate. The method further includes forming a curved recess in the substrate surface adjacent to the nanosheet channel layer stack. The method further includes depositing a protective layer on the curved recess, dummy gate structure, and exposed sidewall surfaces of the nanosheet layer stack, and removing a portion of the protective layer on the curved recess to form a downward-spiked ridge around the rim of the curved recess. The method further includes extending the curved recess deeper into the substrate to form an extended recess, and forming a sacrificial layer at the surface of the extended recess in the substrate.

20 Claims, 9 Drawing Sheets (51) Int. Cl.
| | |
|---|---|
| *H01L 29/08* | (2006.01) |
| *H01L 29/06* | (2006.01) |
| *H01L 21/8234* | (2006.01) |
| *H01L 21/762* | (2006.01) |
| *B82Y 40/00* | (2011.01) |

(52) U.S. Cl.
CPC ...... *H01L 29/0649* (2013.01); *H01L 29/0673* (2013.01); *H01L 29/0847* (2013.01); *H01L 29/6681* (2013.01); *H01L 29/66545* (2013.01); *B82Y 40/00* (2013.01)

(58) Field of Classification Search
CPC ........... H01L 21/762; H01L 21/823481; H01L 29/0673; B82Y 40/00
USPC ......................................................... 257/401
See application file for complete search history.

(56) References Cited

U.S. PATENT DOCUMENTS

| | | |
|---|---|---|
| 9,362,355 B1 | 6/2016 | Cheng et al. |
| 9,620,590 B1 | 4/2017 | Bergendahl et al. |
| 9,773,886 B1 | 9/2017 | Palle et al. |
| 9,799,748 B1 | 10/2017 | Xie et al. |
| 2013/0154007 A1 | 6/2013 | Cheng et al. |
| 2015/0079740 A1* | 3/2015 | Kim .................... H01L 21/8238 438/199 |
| 2015/0333167 A1 | 11/2015 | Leobandung |
| 2017/0133459 A1 | 5/2017 | Pranatharthiharan et al. |
| 2017/0309719 A1 | 10/2017 | Sun et al. |
| 2018/0190829 A1* | 7/2018 | Song ................. H01L 29/66742 |
| 2019/0067120 A1* | 2/2019 | Ching ................. H01L 29/7831 |
| 2019/0334035 A1* | 10/2019 | Chang ............. H01L 21/823431 |

OTHER PUBLICATIONS

Zhang et al., "Novel GAA Si Nanowire p-MOSFETs With Excellent Short-Channel Effect Immunity via an Advanced Forming Process", IEEE Electron Device Letters. vol. 39. No. 4. Apr. 2018. pp. 464-467.

* cited by examiner

NANOSHEET SUBSTRATE TO SOURCE/DRAIN ISOLATION

BACKGROUND

Technical Field

The present invention generally relates to nanosheet devices, and more particularly to electrical separation of a substrate from nanosheet device source/drains.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are coupled together.

SUMMARY

In accordance with an embodiment of the present invention, a method of forming a nanosheet device is provided. The method includes forming a nanosheet channel layer stack and dummy gate structure on a substrate. The method further includes forming a curved recess in the substrate surface adjacent to the nanosheet channel layer stack. The method further includes depositing a protective layer on the curved recess, dummy gate structure, and exposed sidewall surfaces of the nanosheet layer stack, and removing a portion of the protective layer on the curved recess to form a downward-spiked ridge around the rim of the curved recess. The method further includes extending the curved recess deeper into the substrate to form an extended recess, and forming a sacrificial layer at the surface of the extended recess in the substrate.

In accordance with another embodiment of the present invention, a method of forming a nanosheet device is provided. The method includes forming alternating separation layers and nanosheet channel layers on a substrate, and a dummy gate structure on the alternating separation layers and nanosheet channel layers. The method further includes forming a curved recess in the substrate surface adjacent to the nanosheet channel layer stack using a directional etch. The method further includes depositing a protective layer on the curved recess, dummy gate structure, and exposed sidewall surfaces of the nanosheet layer stack. The method further includes removing a portion of the protective layer on the curved recess to form a downward-spiked ridge around the rim of the curved recess. The method further includes extending the curved recess deeper into the substrate to form an extended recess. The method further includes forming a sacrificial layer at the surface of the extended recess in the substrate, and removing the sacrificial layer from the surface of the extended recess to form an enlarged recess.

In accordance with yet another embodiment of the present invention, a nanosheet device is provided. The nanosheet device includes one or more nanosheet channel layer segments on a support pillar formed by a substrate. The nanosheet device further includes an active gate structure on the one or more nanosheet channel layer segments, and an isolation fill layer having a rounded portion adjacent to an upper portion of the support pillar, wherein the isolation fill layer is in an augmented recess and on the sidewalls of the support pillar.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a device with reduced source/drain leakage through the substrate by increasing the separation distance and inserting an insulator material between the substrate and the doped semiconductor source/drains.

Embodiments of the present invention provide a method of increasing the gap between a substrate and the source/drains of a nanosheet device by recessing the substrate adjacent to a nanosheet stack and undercutting a portion of the substrate below a nanosheet stack. A dielectric fill can be deposited in the substrate recess and undercut portion to electrically insulate the source/drains from the substrate.

Exemplary applications/uses to which the present invention can be applied include, but are not limited to: nanosheet transistor devices, logic circuits using nanosheet transistors, and memory circuits using nanosheet transistors.

It is to be understood that aspects of the present invention will be described in terms of a given illustrative architecture; however, other architectures, structures, substrate materials and process features and steps can be varied within the scope of aspects of the present invention.

Figure 1:
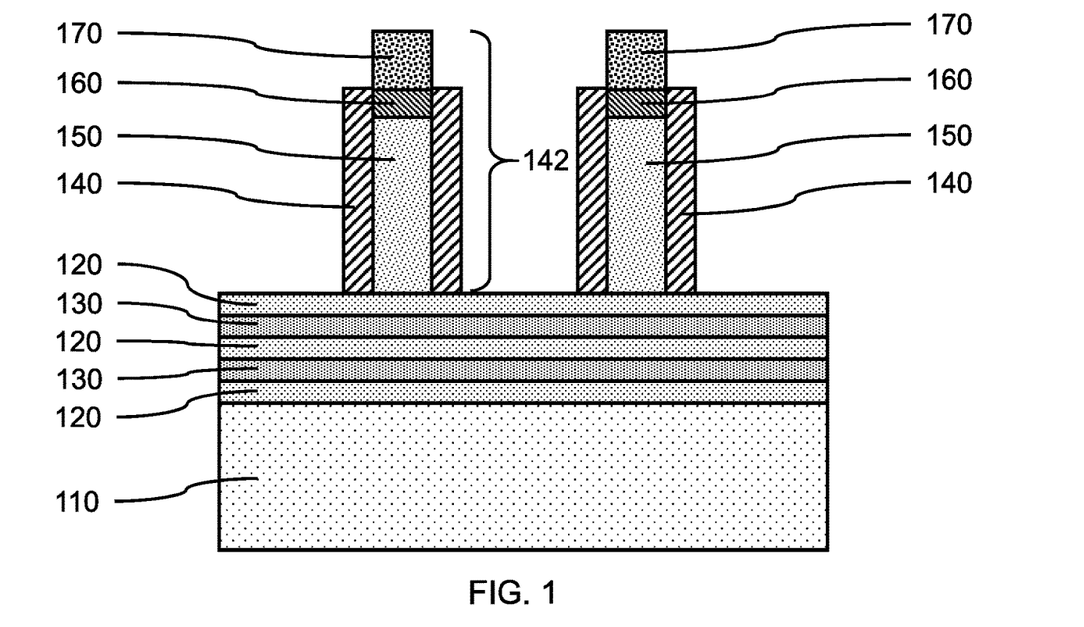
FIG. 1 is a cross-sectional side view showing a dummy gate structure on alternating separation layers and nanosheet channel layers, in accordance with an embodiment of the present invention.

Referring now to the drawings in which like numerals represent the same or similar elements and initially to FIG. 1, a cross-sectional side view of a dummy gate structure on alternating separation layers and nanosheet channel layers is shown, in accordance with an embodiment of the present invention.

In one or more embodiments, a stack of alternating separation layers 120 and nanosheet channel layers 130 can be formed on a substrate 110, where the separation layers 120 and nanosheet channel layers 130 can be formed by epitaxial growth on the substrate 110. In various embodiments, the separation layers 120 and nanosheet channel layers 130 can be a semiconductor material, where the material of the nanosheet channel layers 130 can function as a device channel, and the material of the separation layers 120 can be selectively etched relative to the material of the nanosheet channel layers 130. A nanosheet layer stack can include one or more nanosheet channel layers 130 and one or more separation layers 120, where one of the one or more separation layers 120 can be between the substrate surface and a bottom nanosheet channel layer 130 closest to the substrate surface.

In one or more embodiments, the nanosheet channel layers 130 can be silicon (Si) or silicon-germanium (SiGe), where the nanosheet channel layers 130 can be an intrinsic semiconductor.

In one or more embodiments, the separation layers 120 can be silicon (Si) or silicon-germanium (SiGe), where the separation layers 120 can be the opposite material from the nanosheet channel layers 130. In a non-limiting exemplary embodiment, the nanosheet channel layers 130 can be silicon (Si) and the separation layers 120 can be silicon-germanium (SiGe), so the separation layers 120 can be selectively etched. In a non-limiting exemplary embodiment, the separation layers 120 can be silicon-germanium ($Si_xGe_{1-x}$), where the germanium concentration can be about 30 at. % to about 80 at. %, or about 60 at. % (atomic percent). In another non-limiting exemplary embodiment, the nanosheet channel layers can be silicon-germanium ($Si_xGe_{1-x}$), and the separation layers can be silicon (Si). In various embodiments, the nanosheet channel layers 130 can be the same material as the substrate 110.

In one or more embodiments, the separation layers 120 can have a thickness in a range of about 3 nm to about 20 nm, or in the range of about 10 nm to about 15 nm, or about 10 nm, although other thicknesses are also contemplated.

In one or more embodiments, the nanosheet channel layers 130 can have a thickness in a range of about 2 nm to about 10 nm, or in the range of about 3 nm to about 7 nm, or about 5 nm, although other thicknesses are also contemplated.

In one or more embodiments, a separation layers 120 can be formed on at least a portion of an exposed substrate surface, where the separation layers 120 can be epitaxially grown on a single crystal substrate 110 having a predetermined crystal orientation. The separation layers 120 can be a material that is different from the exposed substrate material, where the separation layers 120 can be heteroepitaxially grown on the substrate surface. (It should be understood that the use of the term epitaxy is intended to cover both homoepitaxy and heteroepitaxy throughout the application.) The material of the separation layers 120 can be selected to reduce inherent strain in the epitaxially grown layer, and the thickness of the separation layers 120 can be kept below the critical thickness at which dislocations (e.g., threading dislocations) could appear.

In one or more embodiments, N nanosheet channel layers 130 alternating with N or N+1 separation layers 120 can form a nanosheet layer stack on a substrate 110, where N can be a predetermined number of nanosheet channel layers 130.

In one or more embodiments, the substrate 110 can be a semiconductor-on-insulator (SeOI) substrate with an active semiconductor surface layer or a semiconductor substrate (e.g., single crystal silicon wafer). In various embodiments, the substrate can be a single crystal silicon (Si) or silicon germanium (SiGe), wafer, or have a single crystal silicon (Si) or silicon germanium (SiGe) surface/active layer. The substrate can include crystalline, semi-crystalline, microcrystalline, or amorphous portions. The substrate can be essentially (i.e., except for contaminants) a single element (e.g., silicon), primarily (i.e., with doping) of a single element, for example, silicon (Si) or germanium (Ge), or the substrate can include a compound, for example, Al$_2$O$_3$, SiO$_2$, SiC, or SiGe.

In various embodiments, a dummy gate structure 142 can be formed on the top layer of the alternating separation layers 120 and nanosheet channel layers 130. The dummy gate structure 142 can include sidewall spacers 140, a dummy gate fill 150, a dummy gate cap 160, and a dummy gate cover 170.

In various embodiments, a dummy gate fill layer can be formed on the top layer of the alternating separation layers 120 and nanosheet channel layers 130. The dummy gate fill layer can be masked an patterned to form on or more a dummy gate fills 150 on the alternating separation layers 120 and nanosheet channel layers 130. In various embodiments, the dummy gate fill 150 can be a material that can be easily and selectively removed from the top layer of the separation layers 120 and nanosheet channel layers 130, including, but not limited to, poly-silicon (p-Si), amorphous silicon (a-Si), amorphous carbon (a-C), silicon oxide (SiO), silicon nitride (SiN), silicon oxynitride (SiON), and combinations thereof.

In one or more embodiments, a sidewall spacer 140 can be formed on each of the dummy gates. The sidewall spacers 140 can be conformally deposited on the dummy gate fill 150 and etched back to expose the top surface of the dummy gate fill 150. The sidewall spacer 140 can be on four sides of the dummy gate fill 150, such that the sidewall spacer 140 is completely around the dummy gate fill 150.

In various embodiments, the sidewall spacer 140 can be a low-k dielectric materials, including, but not limited to, silicon boron carbonitride (SiBCN), silicon oxy carbonitride (SiOCN), SiCOH, or combinations thereof.

In one or more embodiments, the dummy gate cap 160 can be formed on the dummy gate fill 150, where the gate cap layer can be formed on the dummy gate layer, and patterned and etched to form the dummy gate cap 160 with the dummy gate fill 150, before forming the sidewall spacer 140.

In various embodiments, the dummy gate cap 160 can be made of a nitride dielectric material, including silicon nitride (SiN), silicon carbide (SiC), or a combination thereof, where the material of the dummy gate cap 160 can be selectively etched relative to the material of the sidewall spacer 140. In a non-limiting embodiments, the dummy gate cap 160 can be made of stoichiometric silicon nitride (Si$_3$N$_4$).

In one or more embodiments, a dummy gate cover 170 can be formed on the dummy gate cap 160, where the dummy gate cover 170 can be formed by depositing and etching a layer of dummy gate cover material. In various embodiments, the dummy gate cover 170 can be made of silicon oxide (SiO), for example silicon dioxide (SiO$_2$), where the dummy gate cover 170 can be selectively removed relative to the dummy gate cap 160 and the sidewall spacer 140. In a non-limiting embodiments, the dummy gate cover 170 can be made of stoichiometric silicon oxide (SiO$_2$).

Figure 2:
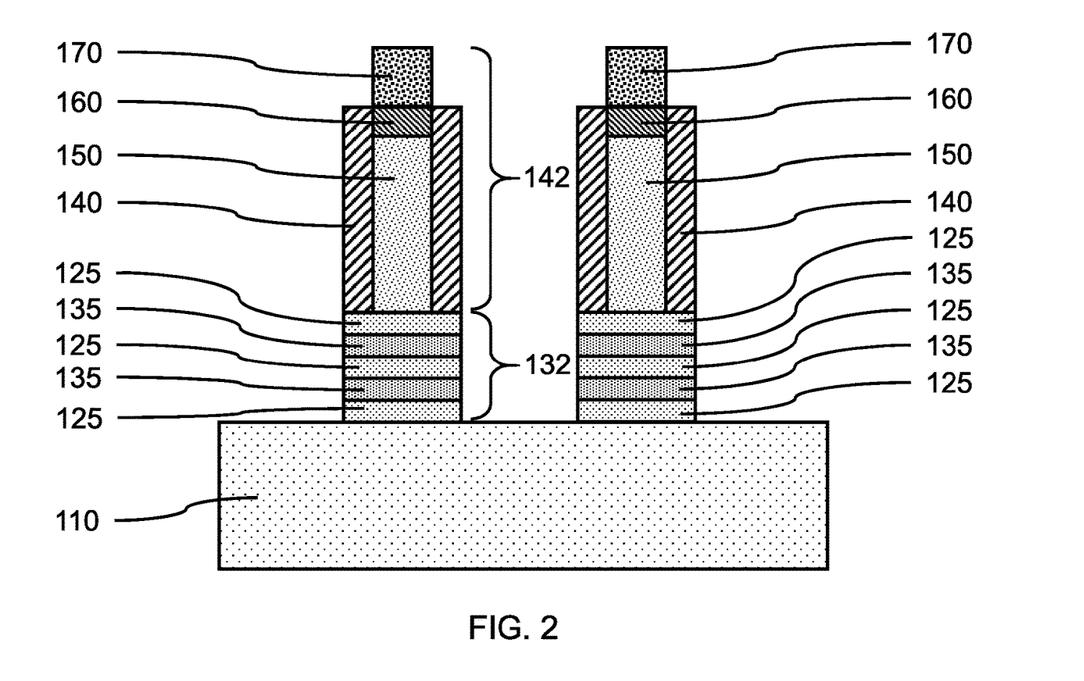
FIG. 2 is a cross-sectional side view showing a dummy gate structure on alternating separation layer segments and nanosheet channel layer segments after performing a layer cut using the dummy gate as a template, in accordance with an embodiment of the present invention.

FIG. 2 is a cross-sectional side view showing a dummy gate structure on alternating separation layer segments and nanosheet channel layer segments after performing a layer cut using the dummy gate as a template, in accordance with an embodiment of the present invention.

In one or more embodiments, portions of the nano sheet channel layers 130 and separation layers 120 can be removed using the dummy gate structure 142 as a template (e.g., a mask) through a stack cut process. Removal of the exposed portions of the nanosheet channel layers 130 and separation layers 120 using a selective, directional etch, for example, a reactive ion etch (RIE) can form alternating separation layer segments 125 and nanosheet channel layer segments 135 under the dummy gate structure. Different RIE processes can be used to selectively remove the different materials of the different layers. The separation layer segments 125 and nanosheet channel layer segments 135 can form a nanosheet channel layer stack 132 beneath the dummy gate structure 142.

Figure 3:
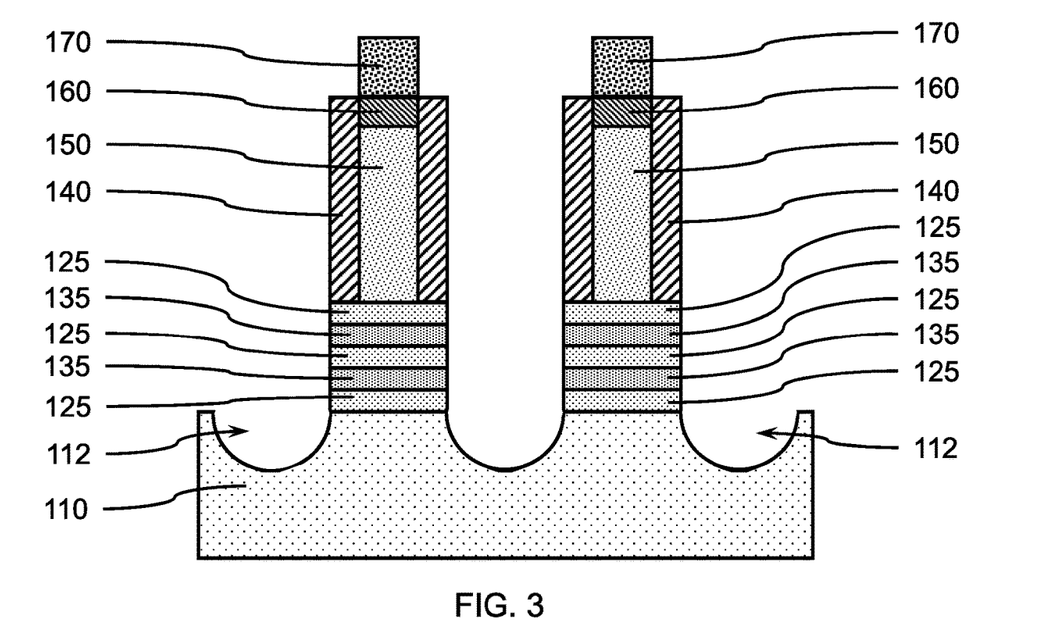
FIG. 3 is a cross-sectional side view showing a dummy gate structure on alternating separation layer segments and nanosheet channel layer segments that form a nanosheet channel layer stack, and a curved recess formed in the surface of the substrate adjacent to the nanosheet channel layer stack, in accordance with an embodiment of the present invention.

FIG. 3 is a cross-sectional side view showing a dummy gate structure on alternating separation layer segments and nanosheet channel layer segments that form a nanosheet channel layer stack, and a curved recess formed in the surface of the substrate adjacent to the nanosheet layer stack, in accordance with an embodiment of the present invention.

In one or more embodiments, the exposed portions of the substrate adjacent to one or more dummy gate structure(s) 142 and nanosheet channel layer stacks 132 can be removed to form curved recess(es) 112 into the surface of the substrate 110, where the curved recess(es) 112 can be formed by a directional etch (e.g., RIE). The RIE process can be controlled to form the curved recess(es) 112 with a deeper etch in the middle of the recess and less of an etch direction adjacent to the nanosheet channel layer stacks 132.

In one or more embodiments, the deepest portion of the curved recess(es) 112 can be about 3 nanometers (nm) to about 10 nm below the top surface of the substrate 110. The depth of the curved recess(es) 112 can be determined by the ability to protect the channel sidewalls during a lateral recess etch.

Figure 4:
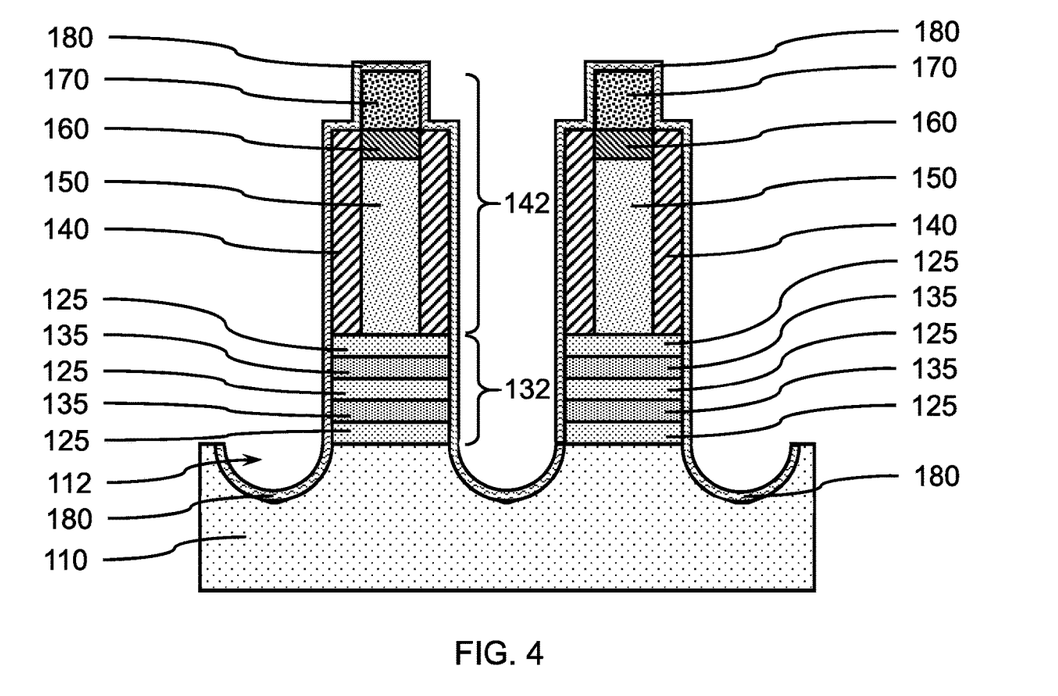
FIG. 4 is a cross-sectional side view showing a protective layer on the dummy gate structure, the exposed sidewall surfaces of the nanosheet channel layer stack, and on the surface of the curved recess in the substrate, in accordance with an embodiment of the present invention.

FIG. 4 is a cross-sectional side view showing a protective layer on the dummy gate structure, the exposed sidewall surfaces of the nanosheet layer stack, and on the surface of the curved recess in the substrate, in accordance with an embodiment of the present invention.

In one or more embodiments, a protective layer 180 can be formed on the dummy gate structure 142, the exposed sidewall surfaces of the nanosheet layer stack 132, and on the surface of the curved recess 112 in the substrate 110. The protective layer 180 can be formed by a conformal deposition, for example, atomic layer deposition (ALD), plasma enhanced ALD (PEALD), or a combination thereof.

In various embodiments, the protective layer 180 can have a thickness in a range of about 1 nm to about 5 nm, or about 2 nm to about 3 nm, although other thicknesses are also contemplated.

In various embodiments, the protective layer 180 can be made of a dielectric material, including, but not limited to, silicon oxycarbide (SiOC), silicon oxynitride (SiON), or a combination thereof, where the protective layer 180 can be selectively etched relative to the dummy gate cover 170, dummy gate cap 160, and the sidewall spacer 140. The protective layer 180 can be a material and thickness that protects the separation layer segments 125 and nanosheet channel layer segments 135 from an oxidizing atmosphere during a subsequent oxidation of the substrate 110.

Figure 5:
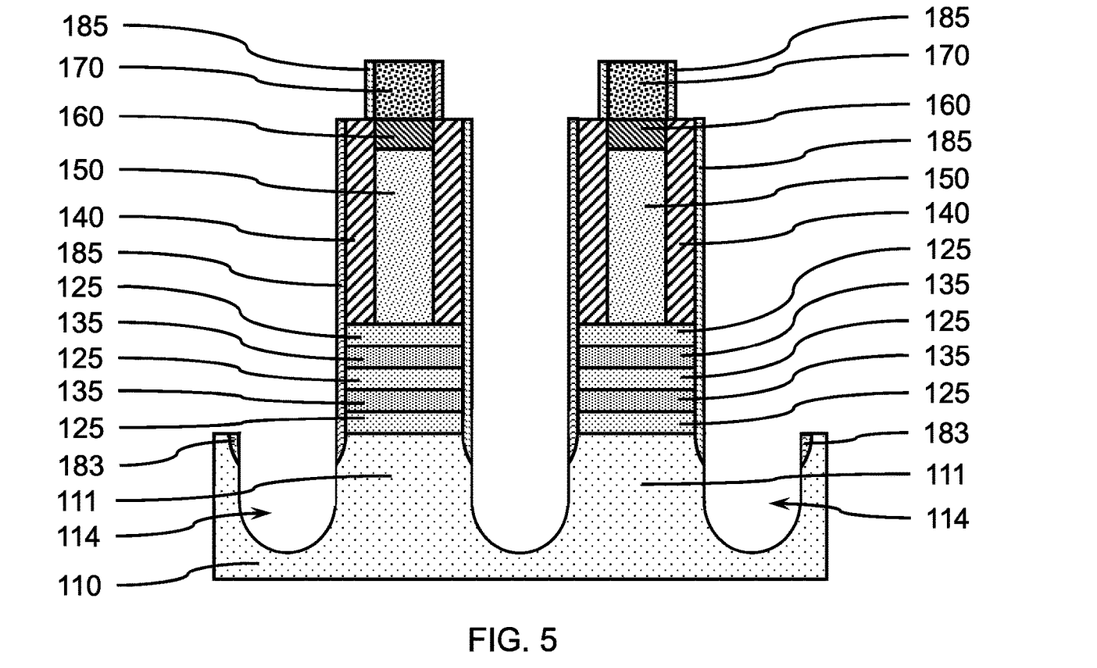
FIG. 5 is a cross-sectional side view showing an extended recess formed in the substrate adjacent to the nanosheet layer stacks through the protective layer on the surface of the curved recess, while the protective layer remains on the exposed sidewall surfaces of the nanosheet layer stack, in accordance with an embodiment of the present invention.

FIG. 5 is a cross-sectional side view showing an extended recess formed in the substrate adjacent to the nanosheet layer stacks through the protective layer on the surface of the curved recess, while the protective layer remains on the exposed sidewall surfaces of the nanosheet layer stack, in accordance with an embodiment of the present invention.

In one or more embodiments, portions of the protective layer 180 on horizontal surfaces can be removed using a directional etch (e.g., RIE), where material approximately perpendicular to the direction of the ion beam can be selectively removed, while material approximately parallel with the ion beam can remain. Portions of the protective layer 180 on the curved recess(es) 112 can be removed, while other portions of the protective layer 180 at the edges of the curved recess(es) 112 can remain to form a downward-spiked ridge 183 around the rim of the curved recess(es) 112 due to the directional nature of the removal process. Portions of the protective layer 180 on the sidewall spacers 140, dummy gate cover 170, and sidewalls of the separation layer segments 125 and nanosheet channel layer segments 135 can form protective layer segments 185.

In various embodiments, the curved recess(es) 112 can be extended into the substrate to form extended recess(es) 114 adjacent to the nanosheet layer stacks 132. The curved recess(es) 112 can be extended into the substrate to form extended recess(es) 114 by an additional distances in a range of about 20 nm to about 50 nm. Formation of the extended recess(es) 114 can form support pillars 111 below the nanosheet layer stack 132 and dummy gate structure 142 from the substrate 110.

Figure 6:
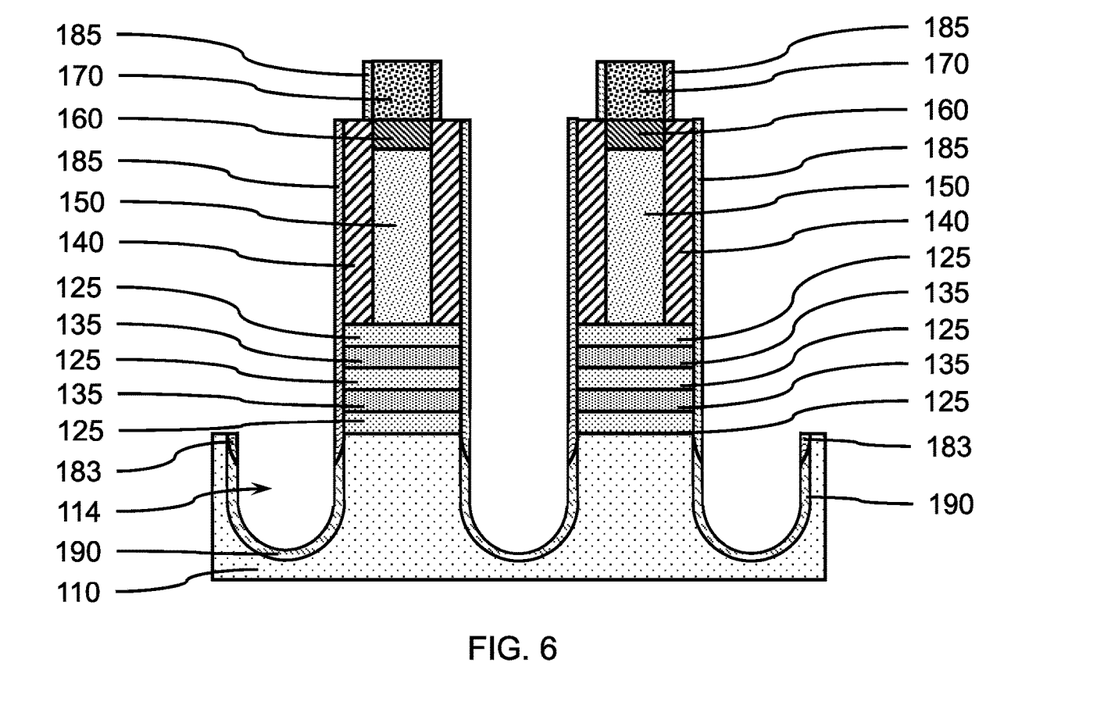
FIG. 6 is a cross-sectional side view showing a sacrificial layer formed on the exposed surfaces of the extended recesses in the substrate, in accordance with an embodiment of the present invention.

FIG. 6 is a cross-sectional side view showing a sacrificial layer formed on the exposed surfaces of the extended recesses in the substrate, in accordance with an embodiment of the present invention.

In one or more embodiments, the exposed surface of the substrate 110 in the extended recess(es) 114 can be reacted with a reactant to form a selectively etchable first sacrificial layer 190. In various embodiments, the exposed surface of the substrate 110 in the extended recess(es) 114 can be reacted with an oxidizing species, for example, oxygen ($O_2$), ozone ($O_3$), oxygen radicals (O•), etc., to form a semiconductor oxide sacrificial layer 190 of the substrate material (e.g., SiO) that can be selectively removed.

In various embodiments, the first sacrificial layer 190 can be formed to a thickness in a range of about 1 nm to about 3 nm, or about 1 nm, where the thickness of the first sacrificial layer 190 can be determined by the time and process parameters of the oxidation process.

In various other embodiments, the first sacrificial layer 190 can be formed by ion implantation into the exposed surface of the substrate, where the ions implanted can alter the etching rate and selectivity of the implanted surface. In a non-limiting exemplary embodiment, arsenic (As) can be implanted into a silicon substrate to alter the etching characteristics of the implanted region. A directional implantation, for example, ion beam implantation of arsine ($AsH_3$), can be used to implant the atomic species.

In various embodiments, the first sacrificial layer 190 formed by ion implantation can have a thickness in a range of about 2 nm to about 10 nm, where the thickness can vary depending on the implantation process used.

Figure 7:
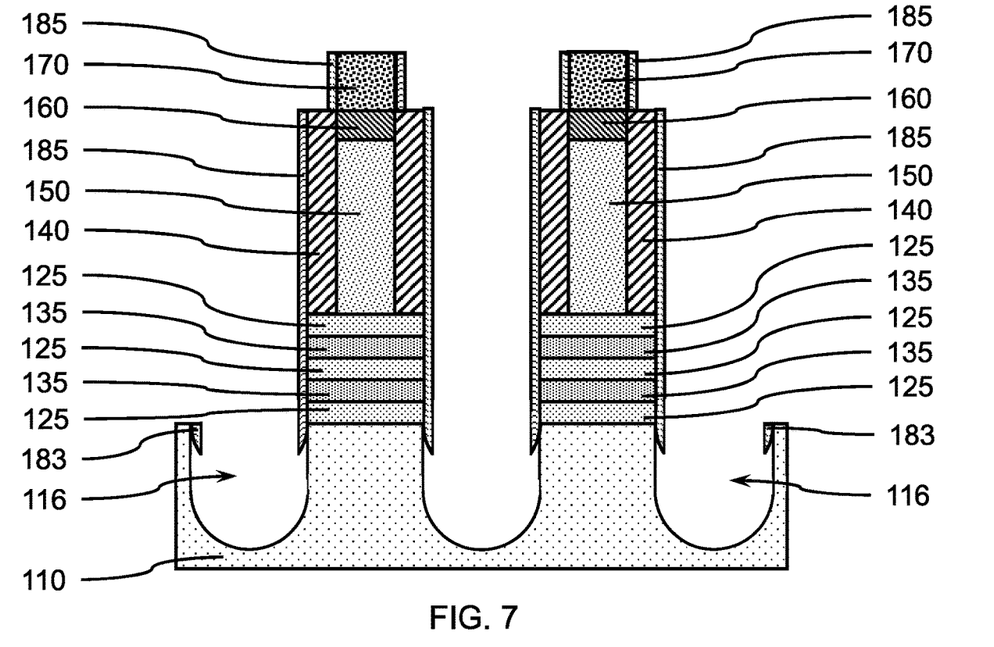
FIG. 7 is a cross-sectional side view showing an enlarged recess after removing the sacrificial layer from the exposed surfaces of the extended recesses, in accordance with an embodiment of the present invention.

FIG. 7 is a cross-sectional side view showing an enlarged recess after removing the sacrificial layer from the exposed surfaces of the extended recesses, in accordance with an embodiment of the present invention.

In one or more embodiments, the first sacrificial layer 190 can be removed to form an enlarged recess 116 from an extended recess 114, where the enlarged recess 116 has greater lateral dimensions by about twice the sacrificial layer 190 thickness, and a greater depth than the extended recess 114 by about the sacrificial layer 190 thickness. The sacrificial layer 190 can be removed using a selective isotropic etch, for example, a wet chemical etch or a dry plasma etch.

The formation and removal of sacrificial layers can be repeated a sufficient number of times to achieve a predetermined depth and undercut distance below the nanosheet channel layer stack 132.

Figure 8:
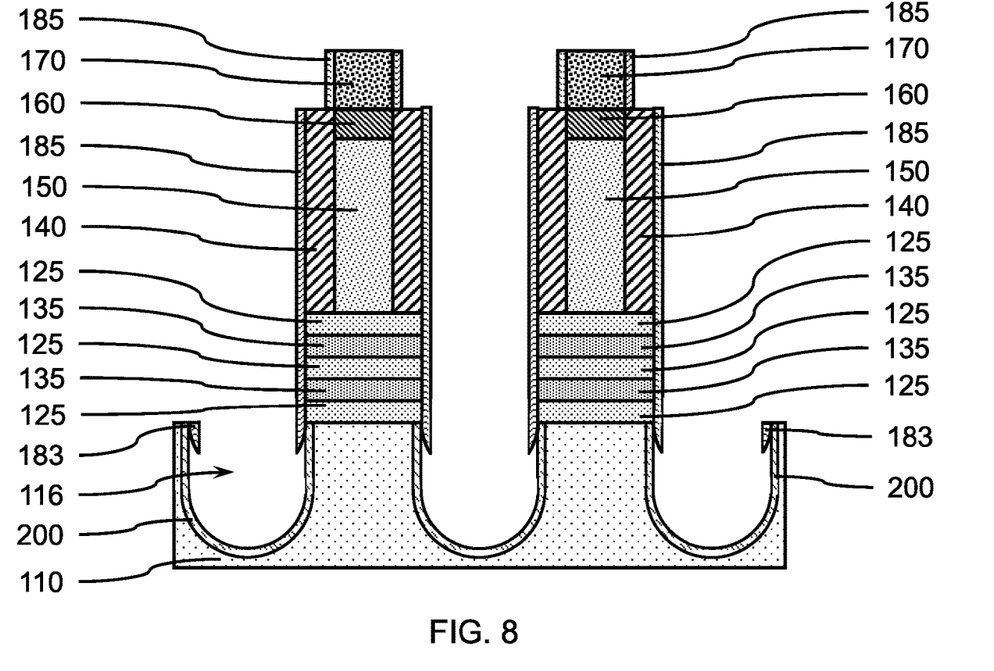
FIG. 8 is a cross-sectional side view showing a second sacrificial layer formed on the exposed surfaces of the enlarged recesses, in accordance with an embodiment of the present invention.

FIG. 8 is a cross-sectional side view showing a second sacrificial layer formed on the exposed surfaces of the enlarged recesses, in accordance with an embodiment of the present invention.

In one or more embodiments, a second sacrificial layer 200 can be formed on the exposed surfaces of the enlarged recesses 116. The second sacrificial layer 200 can be formed using oxidation or implantation. The process used to form the second sacrificial layer 200 can be the same process that was used to form first sacrificial layer 190, or the other of the two processes.

Figure 9:
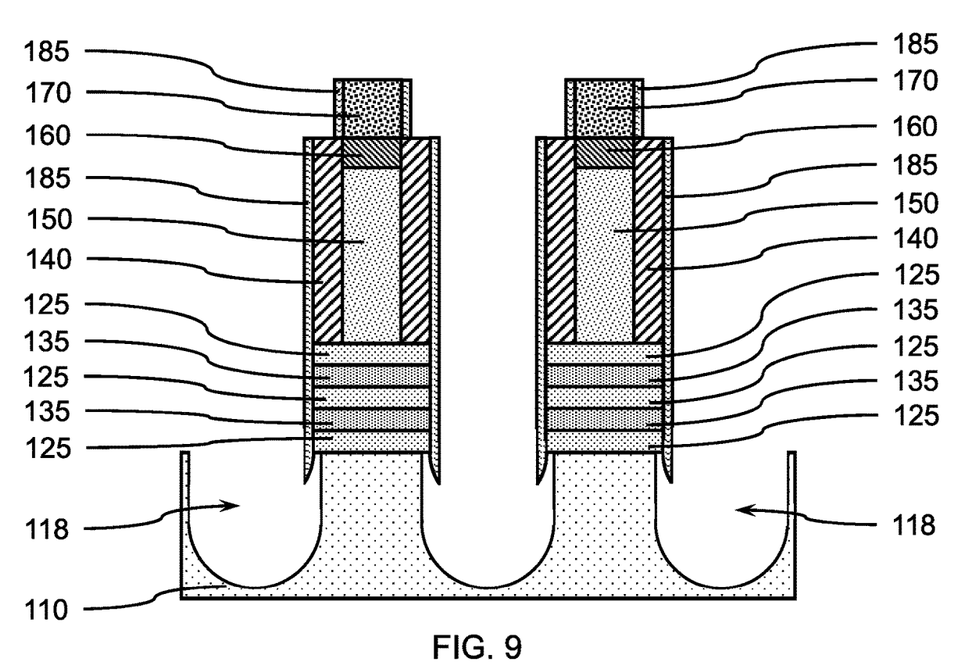
FIG. 9 is a cross-sectional side view showing an augmented recess after removing the second sacrificial layer from the exposed surfaces of the enlarged recesses, in accordance with an embodiment of the present invention.

FIG. 9 is a cross-sectional side view showing an augmented recess after removing the second sacrificial layer from the exposed surfaces of the enlarged recesses, in accordance with an embodiment of the present invention.

In one or more embodiments, the second sacrificial layer 200 can be removed to form an augmented recess 118 from the enlarged recess 116, where the augmented recess 118 has greater lateral dimensions by about twice the second sacrificial layer 200 thickness, and a greater depth than the enlarged recess 116 by about the second sacrificial layer 200 thickness. The second sacrificial layer 200 can be removed using a selective isotropic etch, for example, a wet chemical etch or a dry plasma etch.

In various embodiments, the second sacrificial layer 200 can be under an edge of the bottom separation layer 120 of the nanosheet channel layer stack 132, such that removal of the second sacrificial layer 200 forms an undercut below the bottom separation layer 120.

In various embodiments, the removal of the second sacrificial layer 200 or subsequently formed sacrificial layer can cause the downward-spiked ridge 183 to at least partially break away from the rim of the augmented recess 118 due to a loss of the supporting surface adjoining the downward-spiked ridge 183. A portion of the protective layer segment 185 forming a downward-spiked ridge 183 adjacent to the bottom separation layer 120 of the nanosheet channel layer stack 132 may remain due to the connection to the protective layer segment 185 and support from the sidewalls of the nanosheet channel layer stack 132.

In various embodiments, the augmented recess 118 has a depth in a range of about 25 nm to about 60 nm, or about 35 nm to about 45 nm, although other depths are contemplated. The form and etch steps can be repeated multiple times to form deeper and/or wider augmented recesses.

In various embodiments, the bottom separation layer 120 of the nanosheet channel layer stack 132 can be undercut by a distance in a range of about 10 nm to about 40 nm, or about 20 nm to about 30 nm, or about 10 nm to about 30 nm, or about 20 nm to about 40 nm, although other distances are also contemplated.

Figure 10:
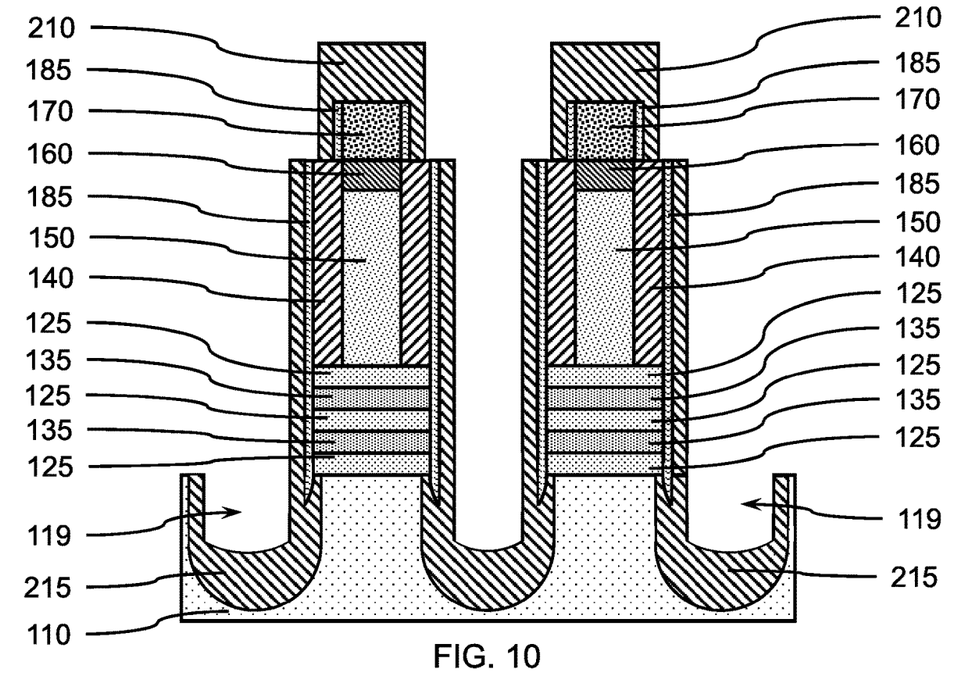
FIG. 10 is a cross-sectional side view showing an isolation fill layer formed in the augmented recess and on the protective layer, in accordance with an embodiment of the present invention.

FIG. 10 is a cross-sectional side view showing an isolation fill layer formed in the augmented recess and on the protective layer, in accordance with an embodiment of the present invention.

In one or more embodiments, an isolation fill layer 215 can be formed in the augmented recess 118, on the sidewalls of the support pillar 111, and on the protective layer segments 185, where the isolation fill layer 215 can be formed by a non-isotropic deposition process, for example, physical vapor deposition (PVD), to provide a thicker isolation fill layer 215 in the bottom of the augmented recess 118, and a thinner isolation fill layer 215 on the sidewalls of the protective layer segments 185. The isolation fill layer 215 can have a depression 119 with a curved bottom surface, where the thickness of the isolation fill layer 215 on the approximately vertical portions of the augmented recess 118 and the shape of the depression 119 can be determined by the parameters of the non-isotropic deposition process (e.g., PVD).

In various embodiments, the isolation fill layer 215 can be silicon nitride (SiN), for example, $Si_3N_4$.

In various embodiments, the isolation fill layer 215 can have a thickness in a range of about 10 nm to about 40 nm, or about 20 nm to about 30 nm, or about 10 nm to about 30 nm, or about 20 nm to about 40 nm, in the bottom of the augmented recess 118, and a thickness in a range of about 5 nm to about 30 nm, or about 10 nm to about 20 nm, or about 5 nm to about 20 nm, or about 10 nm to about 30 nm on the sidewalls of the protective layer segments 185.

Figure 11:
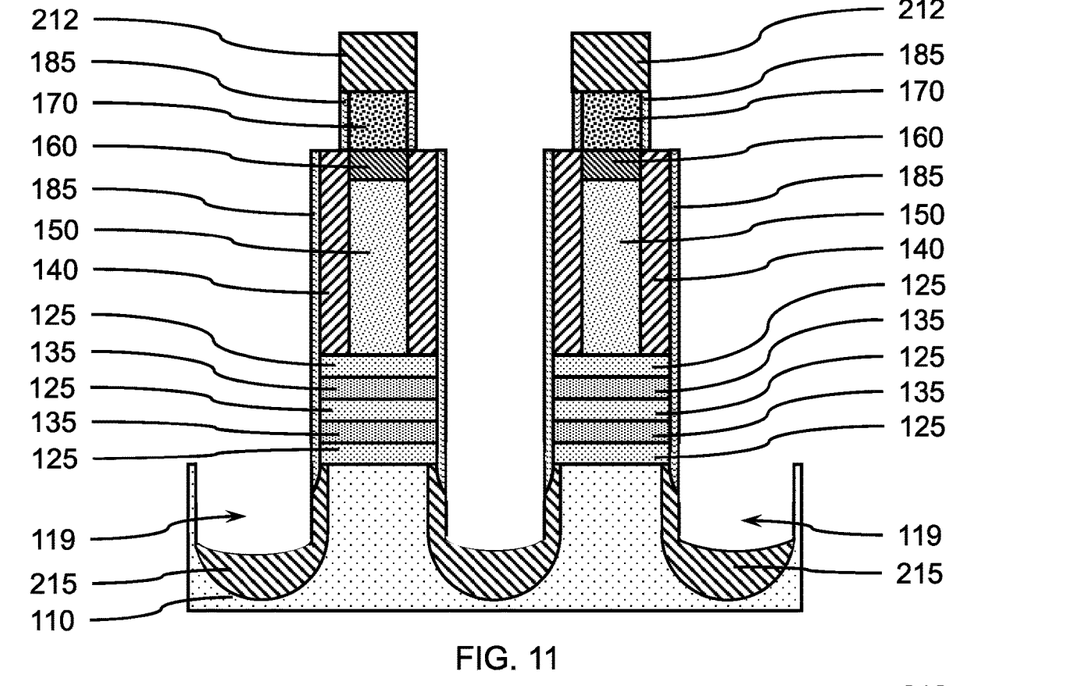
FIG. 11 is a cross-sectional side view showing the isolation fill layer removed from the protective layer on the sidewalls of the dummy gate structure and nanosheet layer stack, and a portion of the isolation fill layer removed from the augmented recess, in accordance with an embodiment of the present invention.

FIG. 11 is a cross-sectional side view showing the isolation fill layer removed from the protective layer on the sidewalls of the dummy gate structure and nanosheet layer stack, and a portion of the isolation fill layer removed from the augmented recess, in accordance with an embodiment of the present invention.

In one or more embodiments, the isolation fill layer 215 can be removed from the protective layer segments 185 on the sidewalls of the dummy gate structure 142 and nanosheet layer stack 132, and a portion of the isolation fill layer 215 can be removed from the augmented recess 118, where the isolation fill layer 215 can be removed using a selective, isotropic etch. The isolation fill layer 215 can be completely removed from the protective layer segments 185 to expose the protective layer segments 185.

Figure 12:
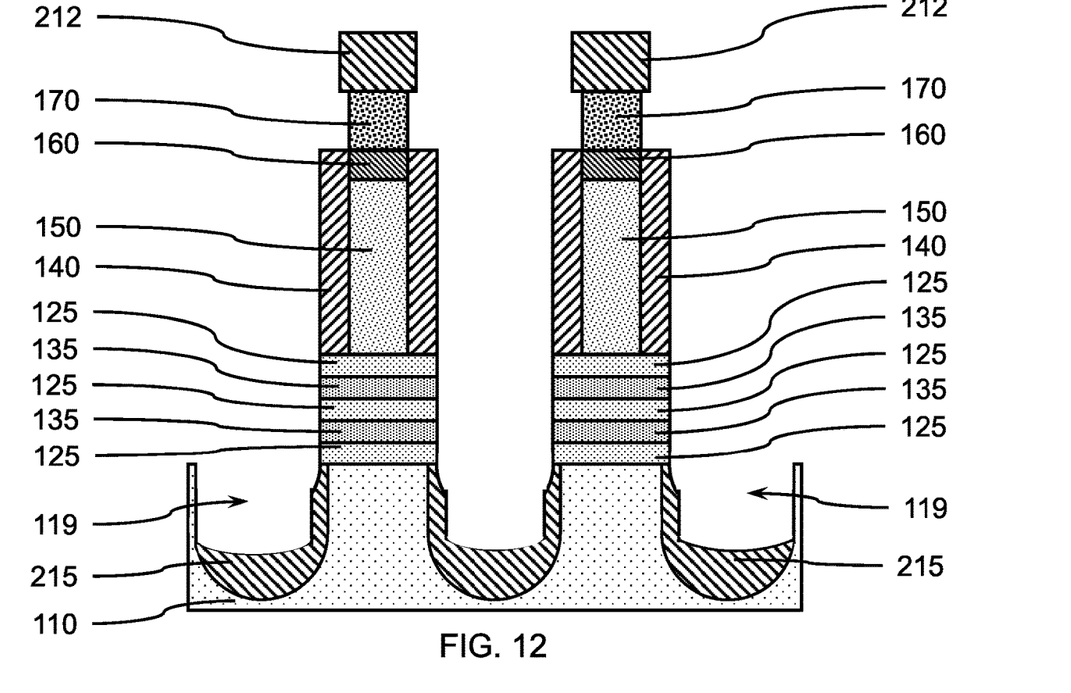
FIG. 12 is a cross-sectional side view showing the protective layer removed from the sidewalls of the dummy gate structure and nanosheet layer stack, in accordance with an embodiment of the present invention.

FIG. 12 is a cross-sectional side view showing the protective layer segments removed from the sidewalls of the dummy gate structure and nanosheet layer stack, in accordance with an embodiment of the present invention.

In one or more embodiments, the protective layer segments 185 can be removed from the sidewall spacers 140, dummy gate cover 170, and sidewalls of the separation layer segments 125 and nanosheet channel layer segments 135, where the protective layer segments 185 can be removed using a selective isotropic etch (e.g., wet chemical etch, dry plasma etch).

Figure 13:
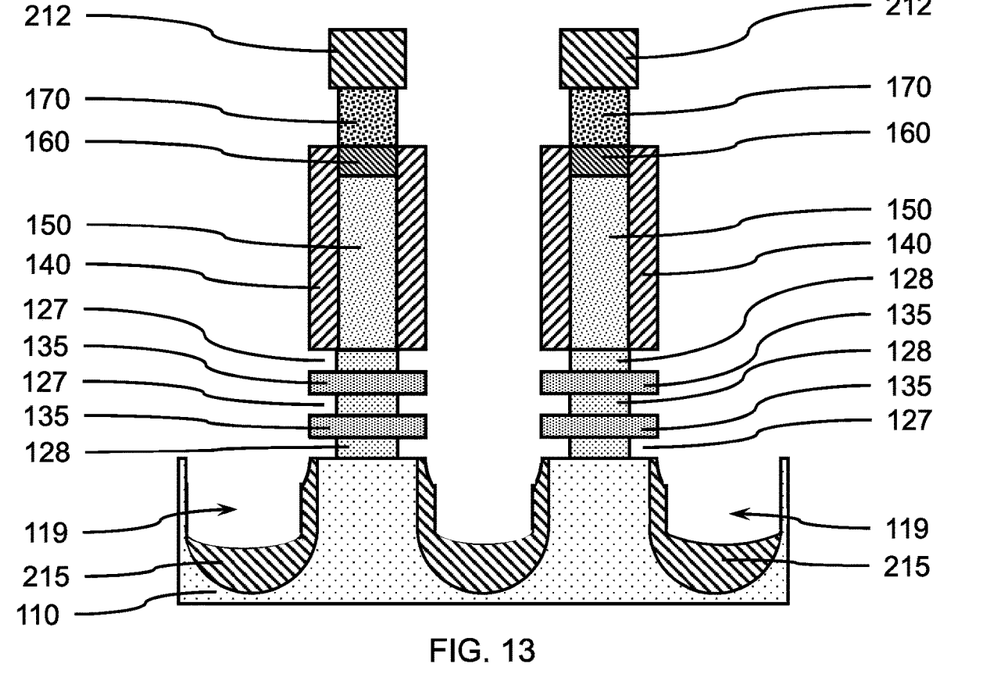
FIG. 13 is a cross-sectional side view showing portions of the alternating separation layer segments removed to form cavities adjacent to the nanosheet channel layers, in accordance with an embodiment of the present invention.

FIG. 13 is a cross-sectional side view showing portions of the alternating separation layer segments removed to form cavities adjacent to the nanosheet channel layers, in accordance with an embodiment of the present invention.

In one or more embodiments, portions of the alternating separation layer segments 125 can be removed to form cavities 127 adjacent to the shortened separation layer segments 128 and nanosheet channel layers 135. The portions of the alternating separation layer segments 125 can be removed using a selective, isotropic etch. The shortened separation layer segments 128 can have a width less than or equal to the width of the dummy gate fill 150.

Figure 14:
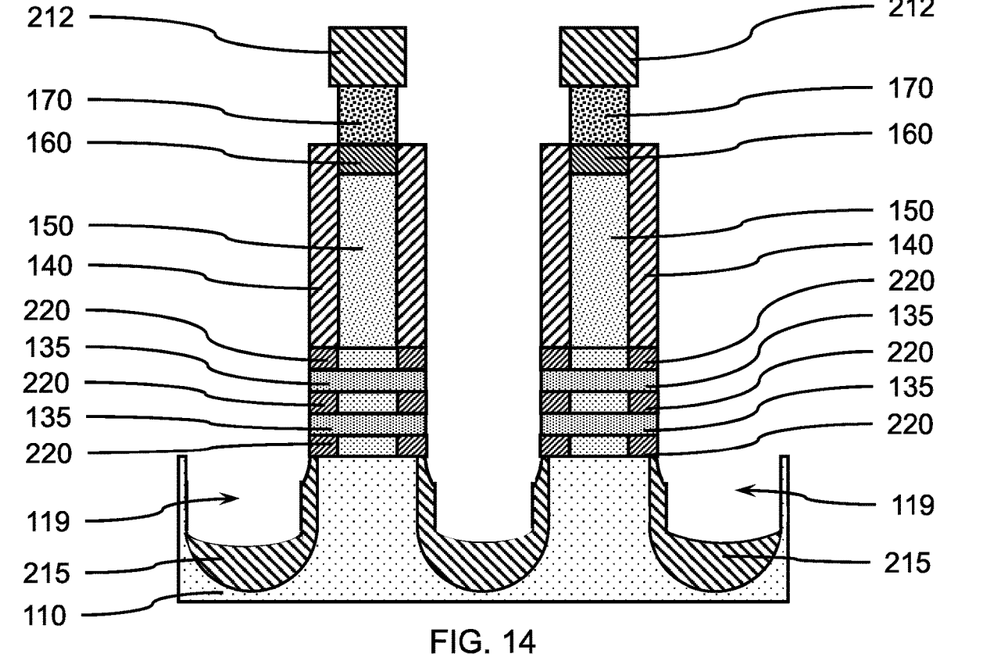
FIG. 14 is a cross-sectional side view showing plugs formed in the cavities adjacent to the nanosheet channel layers, in accordance with an embodiment of the present invention.

FIG. 14 is a cross-sectional side view showing plugs formed in the cavities adjacent to the nanosheet channel layers, in accordance with an embodiment of the present invention.

In one or more embodiments, plugs 220 can be formed in the cavities 127 adjacent to the shortened separation layer segments 128 and nanosheet channel layers 135, where the plugs 220 can be formed by a conformal or isotropic deposition (e.g., ALD, PEALD, chemical vapor deposition (CVD), plasma enhanced CVD (PECVD), and etch processes (e.g. wet and dry chemical etch)).

In various embodiments, the plugs 220 can be made of a dielectric material, for example, a silicon nitride (SiN), a silicon oxide (SiO), a high-k metal oxide, a low-K oxide, or suitable combinations thereof. In various embodiments, the plugs 220 can be $Si_3N_4$ or $SiO_2$.

In various embodiments, the high-K metal oxide can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary. A low-k dielectric material can be a fluoride-doped silicon oxide (e.g., fluoride doped glass), a carbon-doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

Figure 15:
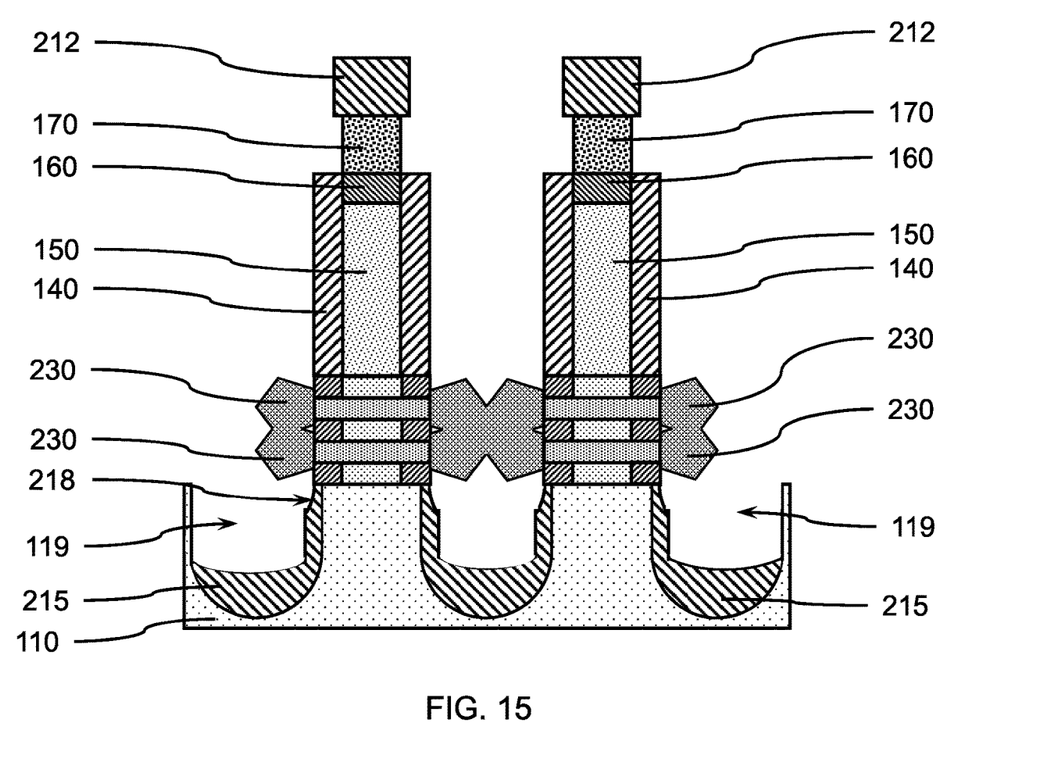
FIG. 15 is a cross-sectional side view showing source/drains formed on the exposed sidewalls of the nanosheet channel layers, in accordance with an embodiment of the present invention.

FIG. 15 is a cross-sectional side view showing source/drains formed on the exposed sidewalls of the nanosheet channel layer segments, in accordance with an embodiment of the present invention.

In one or more embodiments, source/drains 230 can be formed on the exposed sidewalls of the nanosheet channel layer segments 135, where the source/drains 230 can be formed by epitaxial growth on the sidewalls of the nanosheet channel layer segments 135. In various embodiments, the source/drains 230 can be epitaxially grown to a size that source/drains 230 formed on adjacent nanosheet channel layer segments 135 merge into a single source/drain 230. In other embodiments, the source/drains 230 can be grown to a size less than where adjacent source/drains 230 would merge, and a source/drain contact can be formed to each of the individual source/drains 230.

An isolation fill layer 215 having a rounded portion 218 adjacent to an upper portion of the support pillar 111 can be formed in the augmented recess 118 and on the sidewalls of the support pillar 111. The source/drains 230 can be separated from the support pillars 111 below the nanosheet layer stack 132 by the undercut distance and the rounded portion 218 of the isolation fill layer 215 formed by the portion of the protective layer segment 185 forming a downward-spiked ridge 183. The rounded portion can be adjacent to a bottom plug 220, and an upper portion of the support pillar.

Figure 16:
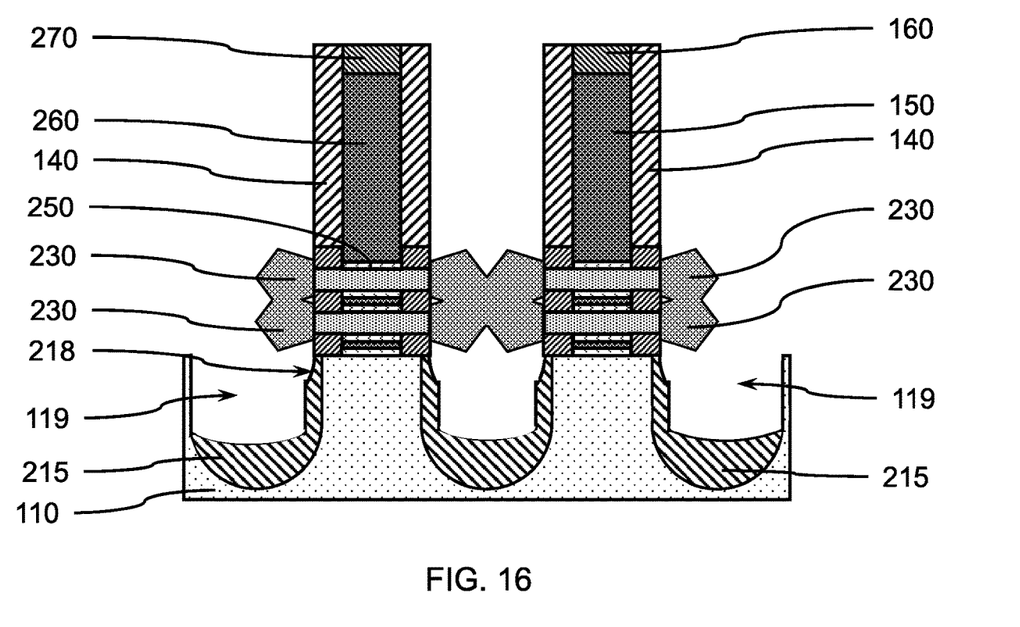
FIG. 16 is a cross-sectional side view showing the dummy gate structure and separation layers replaced with an active gate structure, in accordance with an embodiment of the present invention.

FIG. 16 is a cross-sectional side view showing the dummy gate structure and separation layers replaced with an active gate structure, in accordance with an embodiment of the present invention.

In one or more embodiments, the dummy gate structure 142 and shortened separation layer segments 128 can be replaced with an active gate structure, where the active gate structure includes a gate dielectric layer 250 on the nanosheet layer segments 135 and a conductive gate fill 260 on the gate dielectric layer 250. The conductive gate fill 260 and gate dielectric layer 250 can wrap around a portion of the nanosheet layer segments 135.

Electrical contacts can be formed to the conductive gate fill 260, and to the source/drains 230.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper." and the like, can be used herein for ease of description to describe one element's or feature's relationship to another element(s) or feature(s) as illustrated in the FIGS. It understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating a device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a nanosheet device, comprising:
   forming a nanosheet channel layer stack and dummy gate structure on a substrate;
   forming a curved recess in the substrate surface adjacent to the nanosheet channel layer stack;

depositing a protective layer on the curved recess, dummy gate structure, and exposed sidewall surfaces of the nanosheet layer stack;

removing a portion of the protective layer on the curved recess to form a downward-spiked ridge around the rim of the curved recess;

extending the curved recess deeper into the substrate to form an extended recess; and forming a sacrificial layer at the surface of the extended recess in the substrate.

2. The method of claim 1, wherein the sacrificial layer is formed by oxidizing the portion of the substrate forming the surface of the extended recess.

3. The method of claim 1, wherein the sacrificial layer is formed by ion implantation into the portion of the substrate forming the surface of the extended recess.

4. The method of claim 1, further comprising removing the sacrificial layer from the surface of the extended recess to form an enlarged recess.

5. The method of claim 4, further comprising forming a second sacrificial layer at the surface of the enlarged recess.

6. The method of claim 5, wherein the second sacrificial layer is formed by oxidizing the portion of the substrate forming the surface of the enlarged recess.

7. The method of claim 5, wherein the second sacrificial layer is formed by ion implantation into the portion of the substrate forming the surface of the enlarged recess.

8. The method of claim 5, further comprising removing the second sacrificial layer from the surface of the enlarged recess to form an augmented recess.

9. The method of claim 8, wherein the augmented recess undercuts the nanosheet channel layer.

10. A method of forming a nanosheet device, comprising:
forming alternating separation layers and nanosheet channel layers on a substrate, and a dummy gate structure on the alternating separation layers and nanosheet channel layers;

forming a curved recess in the substrate surface adjacent to the nanosheet channel layer stack using a directional etch;

depositing a protective layer on the curved recess, dummy gate structure, and exposed sidewall surfaces of the nanosheet layer stack;

removing a portion of the protective layer on the curved recess to form a downward-spiked ridge around the rim of the curved recess;

extending the curved recess deeper into the substrate to form an extended recess;

forming a sacrificial layer at the surface of the extended recess in the substrate; and removing the sacrificial layer from the surface of the extended recess to form an enlarged recess.

11. The method of claim 10, wherein the protective layer is made of a dielectric material selected from the group consisting of silicon oxycarbide (SiOC), silicon oxynitride (SiON), and the combination thereof.

12. The method of claim 11, wherein the nanosheet channel layers are silicon (Si) and the separation layers are silicon-germanium (SiGe).

13. The method of claim 12, wherein the sacrificial layer is formed by arsenic (As) implantation into the surface of the extended recess.

14. The method of claim 13, wherein the protective layer has a thickness in a range of about 1 nm to about 5 nm.

15. A nanosheet device, comprising:
one or more nanosheet channel layer segments on a support pillar formed by a substrate;

an active gate structure on the one or more nanosheet channel layer segments; and an isolation fill layer having a rounded portion adjacent to an upper portion of the support pillar, wherein the isolation fill layer is in an augmented recess and on the sidewalls of the support pillar.

16. The nanosheet device of claim 15, further comprising source/drains on each of the one or more nanosheet channel layer segments, wherein a bottom source/drain closest to the support pillar is separated from the support pillar by the rounded portion of the isolation fill layer.

17. The nanosheet device of claim 16, further comprising an active gate structure on the nanosheet channel layer segments, wherein the active gate structure includes a gate dielectric layer on each of the one or more nanosheet channel layer segments and a conductive gate fill on the gate dielectric layer and between adjacent pairs of the one or more nanosheet channel layer segments.

18. The nanosheet device of claim 17, wherein the isolation fill layer is silicon nitride (SiN).

19. The nanosheet device of claim 17, wherein the augmented recess has a depth in a range of about 25 nm to about 60 nm.

20. The nanosheet device of claim 17, wherein the isolation fill layer has a thickness in a range of about 10 nm to about 40 nm on the sidewall of the support pillar.

* * * * *